(12) United States Patent
Ong Kong Chye (10) Patent No.: US 11,716,832 B2
(45) Date of Patent: Aug. 1, 2023

(54) ENCLOSURE FOR PROVIDING LIQUID FILM COOLING

(71) Applicant: Gregory Ong Kong Chye, Singapore (SG)

(72) Inventor: Gregory Ong Kong Chye, Singapore (SG)

( * ) Notice: Subject to any disclaimer, the term of this patent is extended or adjusted under 35 U.S.C. 154(b) by 313 days.

(21) Appl. No.: 17/289,079

(22) PCT Filed: Oct. 30, 2019

(86) PCT No.: PCT/SG2019/050529
§ 371 (c)(1),
(2) Date: Apr. 27, 2021

(87) PCT Pub. No.: WO2020/091690
PCT Pub. Date: May 7, 2020

(65) Prior Publication Data
US 2021/0385974 A1 Dec. 9, 2021

(30) Foreign Application Priority Data

Oct. 31, 2018 (SG) .......................... 10201809662Q (51) Int. Cl.
*H05K 7/20* (2006.01)
(52) U.S. Cl.
CPC ..... *H05K 7/20345* (2013.01); *H05K 7/20318* (2013.01); *H05K 7/20327* (2013.01)
(58) Field of Classification Search
CPC .............. H05K 7/203; H05K 7/20809; H05K 7/20327; H05K 7/20818; H05K 7/20236; H05K 7/20318; H05K 7/20272; H05K 7/208; H05K 7/20345; G06F 1/20; G06F 2200/201; H01L 23/473; H01L 23/4735; H01L 23/44
USPC ...... 165/104.33, 104.21, 80.4; 361/699, 700, 361/679.53, 715
See application file for complete search history.

(56) References Cited

U.S. PATENT DOCUMENTS

| 5,687,577 | A | * | 11/1997 | Ballard | .............. | H05K 7/20345 361/689 |
| 5,907,473 | A | * | 5/1999 | Przilas | ............... | H05K 7/20345 174/15.1 |
| 5,943,211 | A | * | 8/1999 | Havey | ................... | H01L 25/105 174/15.1 |

(Continued)

*Primary Examiner* — Mandeep S Buttar
(74) *Attorney, Agent, or Firm* — Chip Law Group (57) ABSTRACT

An enclosure for providing liquid film cooling to heat generating components includes a chassis, a sump, a first pump, a plumbing system, tube plates, and a heat exchanger. The chassis includes cassettes that hold one or more heat generating components. The sump stores a liquid to be supplied to the heat generating components. The first pump draws the liquid from the sump and supplies the liquid to the tube plates through the plumbing system. Each tube plate is positioned between two cassettes to deliver the liquid to the heat generating components. The tube plates directly spray the liquid onto the heat generating components by way of nozzles embedded on the tube plates. The liquid is evaporated into vapors upon contact with the plurality of heat generating components. The heat exchanger condenses the vapors into condensed liquid upon contact. The condensed liquid is collected in the sump to be re-circulated.

20 Claims, 7 Drawing Sheets

(56) References Cited

U.S. PATENT DOCUMENTS

| | | | | |
|---|---|---|---|---|
| 6,955,062 | B2 * | 10/2005 | Tilton | ................ H05K 7/20345 |
| | | | | 361/699 |
| 7,009,842 | B2 * | 3/2006 | Tilton | ................ H01L 23/4735 |
| | | | | 174/15.1 |
| 7,180,741 | B1 * | 2/2007 | Knight | ............... H05K 7/20345 |
| | | | | 174/15.1 |
| 10,433,460 | B2 * | 10/2019 | Wang | .................. H01L 23/4735 |
| 2005/0168948 | A1 * | 8/2005 | Cader | ................ H05K 7/20345 |
| | | | | 361/699 |
| 2007/0193300 | A1 * | 8/2007 | Tilton | .................... F25B 43/04 |
| | | | | 257/E23.088 |
| 2017/0325358 | A1 * | 11/2017 | Franz | ................ H05K 7/20781 |
| 2019/0212075 | A1 * | 7/2019 | Shin | .......................... F28D 5/02 |
| 2021/0307210 | A1 * | 9/2021 | Wong | ................ H05K 7/20327 |

\* cited by examiner

ENCLOSURE FOR PROVIDING LIQUID FILM COOLING

CROSS REFERENCE TO RELATED APPLICATIONS

This application is a U.S. National Phase of International Patent Application No. PCT/SG2019/050529 filed Oct. 30, 2019, which claims priority benefit of Singapore Patent Application No. SG10201809662Q filed Oct. 31, 2018. Each of the above-referenced applications is hereby incorporated herein by reference in its entirety.

FIELD OF THE INVENTION

The present invention relates to systems for providing liquid cooling, and more particularly to a system to provide liquid film cooling to heat generating components.

BACKGROUND

Modern data centers have thousands of servers and each server includes heat generating components, such as microprocessors, hard disk drives, and memory chips. Thermal management in data centers is vital to avoid mishaps such as overheating and damages to the components. For example, the thermal management may be performed by using a cooling system for removing heat generated by the heat generating components to avoid the above-mentioned mishaps. Energy used for cooling a data center is about 40% of the total energy usage of the data center. Such energy consumption accounts for a huge overhead expense in operating data center facilities. With the advancement in the field of electronics, electronic components have become efficient. As they become efficient, the electronic components tend to produce additional undesirable heat, which is preferably removed. This has created a growing need for higher capacity cooling systems to remove heat from the electronic components.

The common methods of providing cooling in the data centers include a forced air-cooling method, a liquid immersion cooling method, and a direct liquid cooling method. The forced air-cooling method, even though widely used, is an inefficient method of providing cooling in the data centers. The power requirement for the forced air-cooling method is considerably high (about 20-25% of total server power usage) as it requires a considerable amount of energy to force air over the heat generating components. This limits the number of servers that can be accommodated in a rack of a data center.

In the liquid immersion cooling method, electronic components are submerged into a bath of dielectric heat transfer liquid. The low boiling point allows the dielectric liquid to evaporate on surface of the heat generating components. The liquid immersion cooling method is more effective than the forced air-cooling method but has disadvantages of its own. The liquid immersion cooling method requires a large quantity of expensive liquid, and hence the method is costly. Further, immersion baths containing the liquid occupy space up to four or more rack footprints in the data center, and hence requires a considerable floor space. The immersion baths weigh in excess of 1500 kilograms, and hence floor loading in the data center is inadequate. Special engineering requirements, such as load spreaders, are required that take up additional space and raise safety concerns. This makes the method inefficient in terms of space planning.

The direct liquid cooling method includes specially designed component cooling heat sink housings built onto the heat generating components. The housings are then inter-connected via pressurized tubes to deliver the liquid, normally in the form of a synthetic oil or water, directly onto to the heat generating components. Although this method has some advantages over the forced air-cooling and the immersion liquid cooling methods, there are few drawbacks. In case of the direct liquid cooling, there is no phase change of the liquid and hence the cooling efficiency is highly dependent on flow rate and temperature of the liquid. Furthermore, each housing needs to be customized to size, shape, and position of the heat generating components which are unique to each server motherboard.

Another method for providing cooling in the data centers is a direct spray cooling method. The direct spray cooling is an efficient form of liquid cooling. The direct spray cooling method overcomes the disadvantages of the abovementioned cooling methods. The direct spray cooling method uses a dielectric liquid that forms thin film on the surfaces of the heat generating components. The film of the dielectric liquid absorbs heat from the heat generating components as it evaporates into vapor completing a heat transfer process upon contacting the heat generating components. The cooling capacity of the direct spray cooling method is superior as compared to the forced air-cooling, liquid immersion, or the direct liquid cooling methods. Moreover, energy consumed by the liquid film cooling method is considerably less compared to the forced air-cooling method as it eliminates the need for multiple cooling fans.

Traditional systems using the direct spray cooling include the heat generating components housed in an enclosure and essential components such as a heat exchanger, a pump, a plumbing system, a sump, and the like, for cooling the heat generating components are positioned outside the enclosure. This leads to inefficiency in providing cooling to the heat generating components as a significant amount of energy is used when the vapor is transferred to the heat exchanger for condensation externally. Further, the traditional systems use a common heat exchanger for all enclosures mounted on a rack in the data centers. This further hamper the performance, deployability, and efficiency of the traditional systems. For example, US patent application 2007/0199340 A1, by Paul Knight et. al, discloses a spray cooling system that includes a sealed chassis for housing a card assembly and a spray module that has nozzles embedded on it to dispense dielectric fluid on to the card assembly. However, in the patent application, pump, heat exchanger, and reservoir are located outside the cooling system, which leads to inefficiency in providing cooling to the card assembly, as well as hampers the performance, deployability, and efficiency of the cooling system. Further, the dielectric fluid has to flow against the gravity to reach the nozzles. This leads to inefficient cooling of the card assembly as the fluid may not be equally dispensed over the entire card assembly. To provide efficient cooling, stronger pumps would be required, which in turn would lead to increase in power consumption.

U.S. Pat. No. 7,992,626 B 1, by Charles L. Tilton et. al, discloses a combination spray and cold plate thermal management system that includes a spray unit and a coolant reservoir thermally connected to a heat producing device and fluidly connected to the spray unit. The spray unit includes nozzles that spray coolant on the heat producing device while the coolant reservoir retains waste coolant and allows for annular flow of a two-phased coolant in both a vaporized state and a fluid state. However, thermal management unit including pumps, filters, and heat exchangers, is located outside the thermal management system, thereby leading to an inefficiency in providing cooling to the heat producing device and hampering the performance, deployability, and efficiency of the thermal management system. Further, while the coolant reservoir assists in thermal management of the heat producing device, having a coolant reservoir makes the system bulky.

Further, U.S. Pat. No. 5,943,211 A, by Mort L. Havey, discloses a heat spreader system for cooling heat generating components that includes a sealed housing. The sealed housing includes a spray plate that distributes a liquid coolant as a thin film over the surface of the heat generating components. Heat is transferred from the surface of the heat generating components by vaporization of at least a portion the thin film of liquid. The coolant condenses on the housing and returns to the liquid state and is collected in a reservoir located inside the sealed housing. The sealed housing also includes a pump for recirculating the liquid coolant to the atomizers. The patent also discloses use of heat exchanger tubes inside the sealed housing to provide additional cooling. However, the spray plates distribute the liquid coolant from a single end of the sealed housing and thus leads to inefficiency in cooling of the heat generating components.

In light of the foregoing, there exists a need for a system that provides a significantly improved cooling for heat generating components and that can reduce floor space for its deployment. Also, there exists a need for a system that solves the above-mentioned problems, provides an improved environment for heat generating components that are located within the system, and allows ease of deployment of a cooling system.

SUMMARY OF THE INVENTION

In an embodiment of the present invention, an enclosure for providing liquid film cooling to a plurality of heat generating components is provided. The enclosure includes a chassis, a sump, a first pump, a plumbing system, a plurality of tube plates, and a heat exchanger. The chassis includes a plurality of cassettes. Each cassette of the plurality of cassettes includes one or more heat generating components of the plurality of heat generating components. The plurality of cassettes is slidably attached to the chassis. The sump stores a liquid to be supplied to the plurality of heat generating components. The first pump draws the liquid from the sump. The plumbing system receives the liquid from the sump by way of the first pump. The plurality of tube plates is connected to the plumbing system to receive the liquid. A tube plate of the plurality of tube plates is placed between a first cassette and a second cassette of the plurality of cassettes. The plurality of tube plates directly sprays the liquid onto the plurality of heat generating components by way of nozzles embedded on the plurality of tube plates. The liquid is evaporated into vapors upon contact with the plurality of heat generating components. The heat exchanger is placed below the chassis. The heat exchanger condenses the vapors into condensed liquid upon contact. The condensed liquid is collected in the sump.

In another embodiment of the present invention, a rack having a plurality of shelves is provided. The rack includes a plurality of enclosures positioned on a shelf of the plurality of shelves. A first enclosure of the plurality of enclosures is accessible from a front end of the rack and a second enclosure of the plurality of enclosures is accessible from a back end of the rack. Each of the first and second enclosures of the plurality of enclosures includes a chassis, a sump, a first pump, a plumbing system, and a plurality of tube plates. The chassis includes a plurality of cassettes. Each cassette of the plurality of cassettes includes one or more heat generating components of the plurality of heat generating components. The plurality of cassettes is slidably attached to the chassis. The sump stores a liquid to be supplied to the plurality of heat generating components. The first pump draws the liquid from the sump. The plumbing system receives the liquid from the sump by way of the first pump. The plurality of tube plates is connected to the plumbing system to receive the liquid. A tube plate of the plurality of tube plates is placed between a first cassette and a second cassette of the plurality of cassettes. The plurality of tube plates allows to directly spray the liquid onto the plurality of heat generating components by way of nozzles embedded on the plurality of tube plates. The liquid is evaporated into vapors upon contact with the plurality of heat generating components.

Various embodiments of the present invention provide an enclosure for providing liquid film cooling to the plurality of heat generating components. The enclosure includes a chassis. The chassis includes a plurality of cassettes, and the plurality of cassettes include one or more heat generating components of the plurality of heat generating components. The chassis includes at least one power supply unit to supply power to the one or more heat generating components. The chassis includes at least one network switch to provide network connectivity externally to at least a local area network or an Internet. The chassis includes a backplane housed at a back end of the chassis to allow the plurality of cassettes to share a common power and data bus with at least one power supply and the at least one network switch.

The enclosure includes a sump to store the liquid to be supplied to the plurality of heat generating components. The enclosure includes a first pump to draw the liquid from the sump. The enclosure further includes a second pump for drawing the liquid from the sump. At a time instant, at least one of the first and second pumps is operational. The enclosure includes a plumbing system that receives the liquid by way of the first or second pumps. The plumbing system is equipped with back flow check valves to prevent the liquid from circulating back through the first and second pumps when at least one of the first and second pumps is non-operational. The enclosure includes a plurality of tube plates connected to the plumbing system for receiving the liquid. A tube plate of the plurality of tube plates is placed between a first cassette and a second cassette of the plurality of cassettes. The plurality of tube plates absorb heat from the plurality of heat generating components by way of radiation and transfer the heat to the liquid circulating inside the plurality of tube plates.

The plurality of tube plates directly spray the liquid onto the plurality of heat generating components by way of nozzles embedded on the plurality of tube plates. The liquid is evaporated into vapors upon contact with the plurality of heat generating components. The plurality of tube plates further provides condensation of the vapors into the condensed liquid when the vapors come in contact with the plurality of tube plates. The enclosure includes bypass valves connected between the plumbing system and the plurality of tube plates to control a flow of liquid in the plurality of tube plates. The heat exchanger condenses the vapors into condensed liquid when the vapors come in contact with the heat exchanger, and the condensed liquid is collected in the sump. The enclosure includes a plurality of sensors to monitor health and operating parameters of the enclosure. The plurality of sensors includes at least one of a temperature sensor, a flow sensor, a pump sensor, a humidity sensor, a fouling sensor, a voltage sensor, an accelerometer, a door sensor, a backplane sensor, a pressure sensor, or humidity and vapor saturation sensors.

The enclosure includes a management control system to monitor and manage the enclosure based on outputs received from the plurality of sensors. The enclosure further includes a cartridge to purge non-vapor gases outside the enclosure and prevent the vapors from venting outside the enclosure. The presence of the heat exchanger inside each enclosure ensures that the vapors formed due to evaporation of the liquid are condensed back into the condensed liquid immediately, and hence there is no loss of vapor. The plurality of tube plates performs a two-fold function of spraying the liquid onto the plurality of heat generating components and condensing the vapors into the condensed liquid. Thus, the plurality of tube plates enhances the condensation process and reduce energy lost during the condensation. The design of the plurality of tube plates and positions of the nozzles on the plurality of tube plates ensure that an entire surface of the heat generating components is coated with the liquid and heat is uniformly removed from the heat generating components.

BRIEF DESCRIPTION OF THE DRAWINGS

The accompanying drawings illustrate the various embodiments of systems, methods, and other aspects of the invention. It will be apparent to a person skilled in the art that the illustrated element boundaries (e.g., boxes, groups of boxes, or other shapes) in the figures represent one example of the boundaries. In some examples, one element may be designed as multiple elements, or multiple elements may be designed as one element. In some examples, an element shown as an internal component of one element may be implemented as an external component in another, and vice versa.

Various embodiments of the present invention are illustrated by way of example, and not limited by the appended figures, in which like references indicate similar elements.

Further areas of applicability of the present invention will become apparent from the detailed description provided hereinafter. It should be understood that the detailed description of exemplary embodiments is intended for illustration purposes only and is, therefore, not intended to necessarily limit the scope of the invention.

DETAILED DESCRIPTION

The present invention is best understood with reference to the detailed figures and description set forth herein. Various embodiments are discussed below with reference to the figures. However, those skilled in the art will readily appreciate that the detailed descriptions given herein with respect to the figures are simply for explanatory purposes as the methods and systems may extend beyond the described embodiments. In one example, the teachings presented and the needs of a particular application may yield multiple alternate and suitable approaches to implement the functionality of any detail described herein. Therefore, any approach may extend beyond the particular implementation choices in the following embodiments that are described and shown.

References to "an embodiment", "another embodiment", "yet another embodiment", "one example", "another example", "yet another example", "for example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in an embodiment" does not necessarily refer to the same embodiment.

Liquid used in the present invention is a dielectric fluid, such as a hydrofluorocarbon (HFC) or a hydrofluoroether (HFE). The liquid is non-conductive, non-corrosive, low surface tension, low temperature, and phase transition fluid. The dielectric fluid can be used in direct contact with heat generating components, such as central processing units (CPUs), graphics processing units (GPUs), memory modules, and power devices without shorting electrical connections. Examples of the dielectric fluid include HFE-7000 and HFE-7100 (as well as HFE-7200, HFE-7300, HFE-7500, HFE-7500, and HFE-7600) that are commercially available as Novec Engineered Fluids from 3M Company headquartered in Mapleton, Minn.

Another common brand of the dielectric fluid is a perfluorocarbon manufactured by 3M under the federally registered trademark Fluorinert. Fluorinert is a brand that represents a family of perfluorocarbon fluids. Each perfluorocarbon fluid has unique phase change properties. Fluorinert 5060 is ideal for many cooling applications as it changes phase from a liquid to a vapor in the range of 50 degrees C. at standard pressures. Other grades may suit a particular application better than others. The present invention should not be construed to be limited to Novec and Fluorinert as dielectric fluids. Other dielectric fluids can also be used within the scope and spirit of the invention.

Figure 1A:
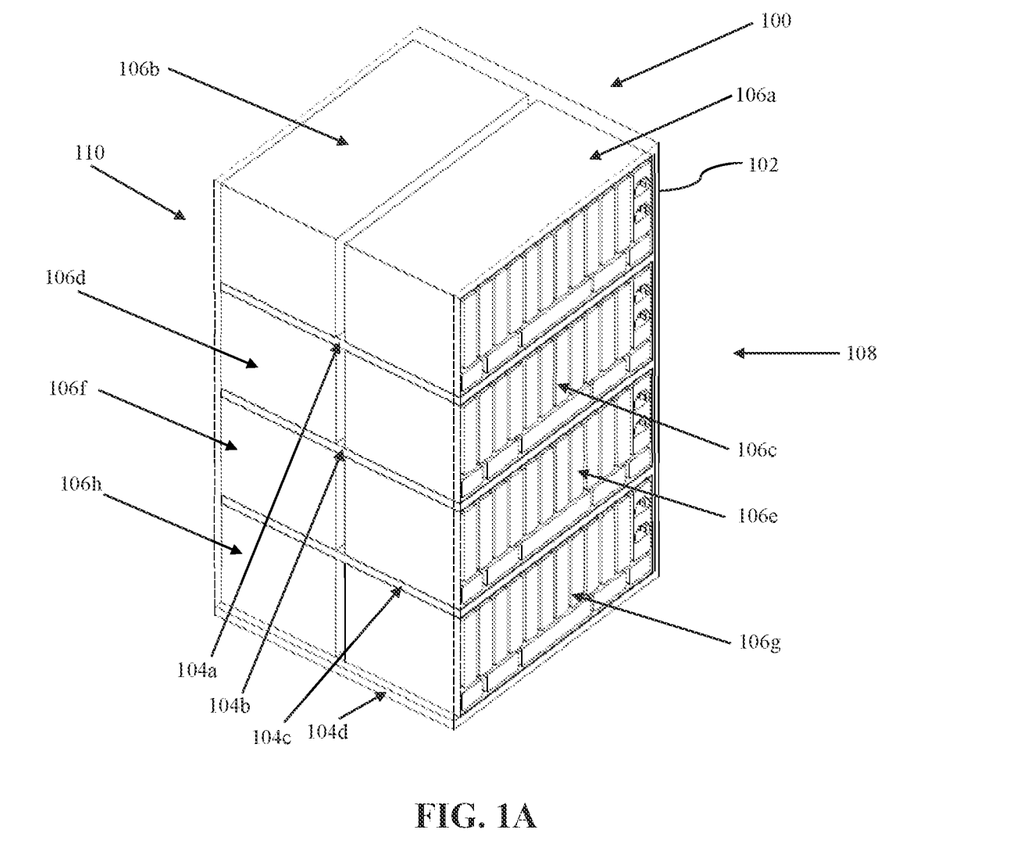
FIG. 1A illustrates a rack in a data center, in accordance with an embodiment of the present invention.
Figure 1B:
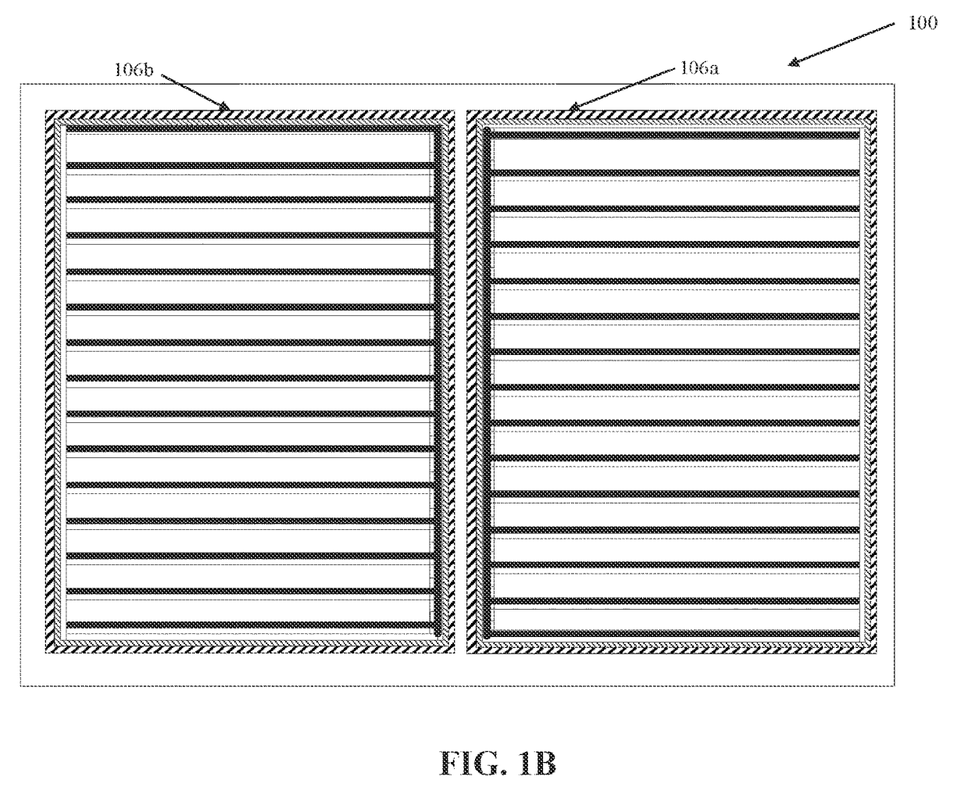
FIG. 1B illustrates a top view of the rack of FIG. 1A, in accordance with an embodiment of the present invention.

FIG. 1A illustrates a rack 100 in a data center (not shown) and FIG. 1B illustrates a top view of the rack 100 of FIG. 1A, in accordance with an embodiment of the present invention. The data center may house various types of servers (not shown), such as cloud servers, dedicated servers, or the like. The rack 100 has vertical supports 102 and equidistantly positioned horizontal shelves 104a-104d on which enclosures 106a-106h may be mounted. In an embodiment, the rack 100 is made up of metals such as steel, aluminum, or the like. A first enclosure 106a of the enclosures 106a-106h includes a set of cassettes that hold the heat generating components, and a cooling system to provide liquid film cooling to the heat generating components. The first enclosure 106a is self-contained, i.e., the first enclosure 106a includes all the necessary components required to provide the liquid film cooling to the heat generating components housed inside the first enclosure 106a. The first enclosure 106a provides access to the set of cassettes. The first enclosure 106a can be mounted on any standard data center racks. The rack 100 illustrates four shelves 104a-104d to provide clarity and understanding of invention and should not be considered as the exact implementation of the rack 100. It will be understood by a person skilled in the art that the rack 100 may have more than four shelves 104a-104d, and hence can accommodate more than eight enclosures 106a-106h.

As shown in FIG. 1B, the rack 100 has two enclosures, including the first enclosure 106a and a second enclosure 106b, mounted on the shelf 104a. In another embodiment, the rack 100 includes more than two enclosures mounted on the shelf 104a. The first and second enclosures 106a and 106b can be mounted in the rack 100 in such a way that the first enclosure 106a is accessible from a front end 108 of the rack 100 and the second enclosure 106b is accessible from a back end 110 of the rack 100. In an embodiment, the enclosures 106a-106h have a series of holes embedded on them that allow the enclosures 106a-106h to be mounted on the shelves 104a-104d of the rack 100 by way of bolts. In an embodiment, the rack 100 includes first and second doors (not shown) at the front and back ends 108 and 110 of the rack 100, respectively. In an embodiment, the enclosures 106a-106h are made up of steel, aluminum, and the like.

Figure 2A:
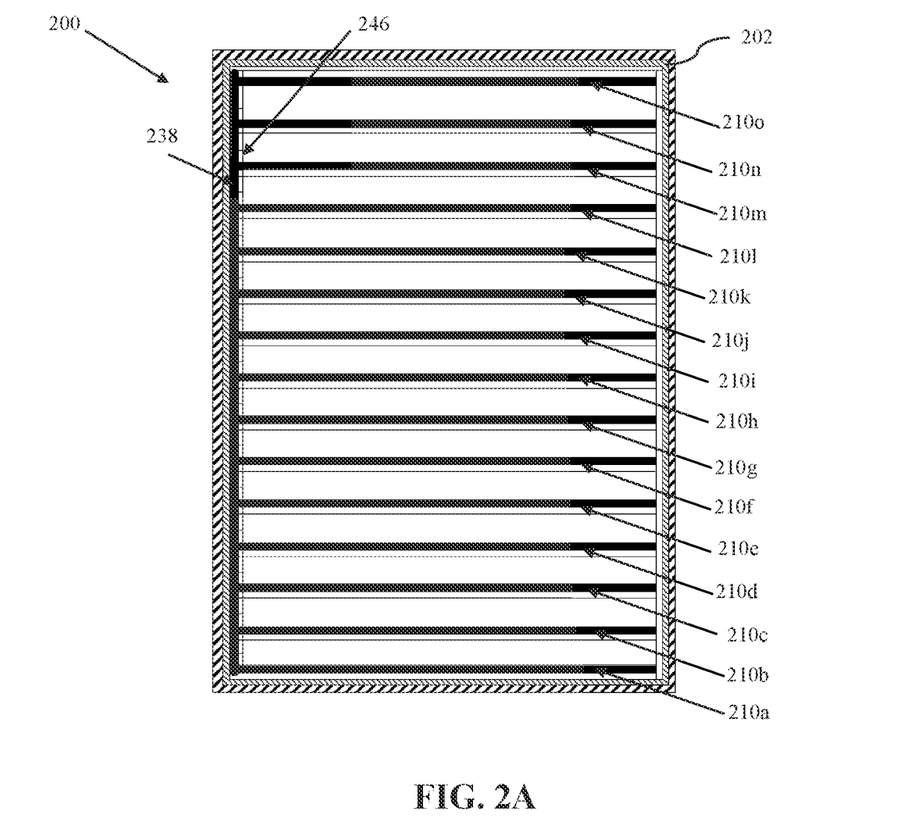
FIG. 2A illustrates a top view of an enclosure that provides a liquid film cooling to heat generating components, in accordance with an embodiment of the present invention.
Figure 2B:
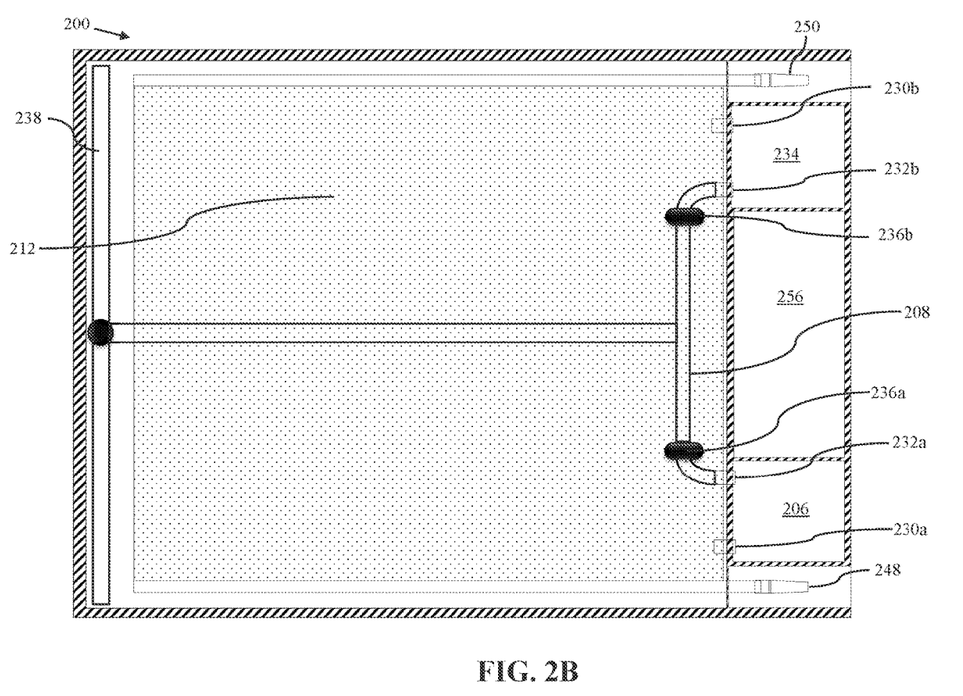
FIG. 2B illustrates a top cutaway view of the enclosure that provides the liquid film cooling to the heat generating components, in accordance with an embodiment of the present invention.
Figure 2C:
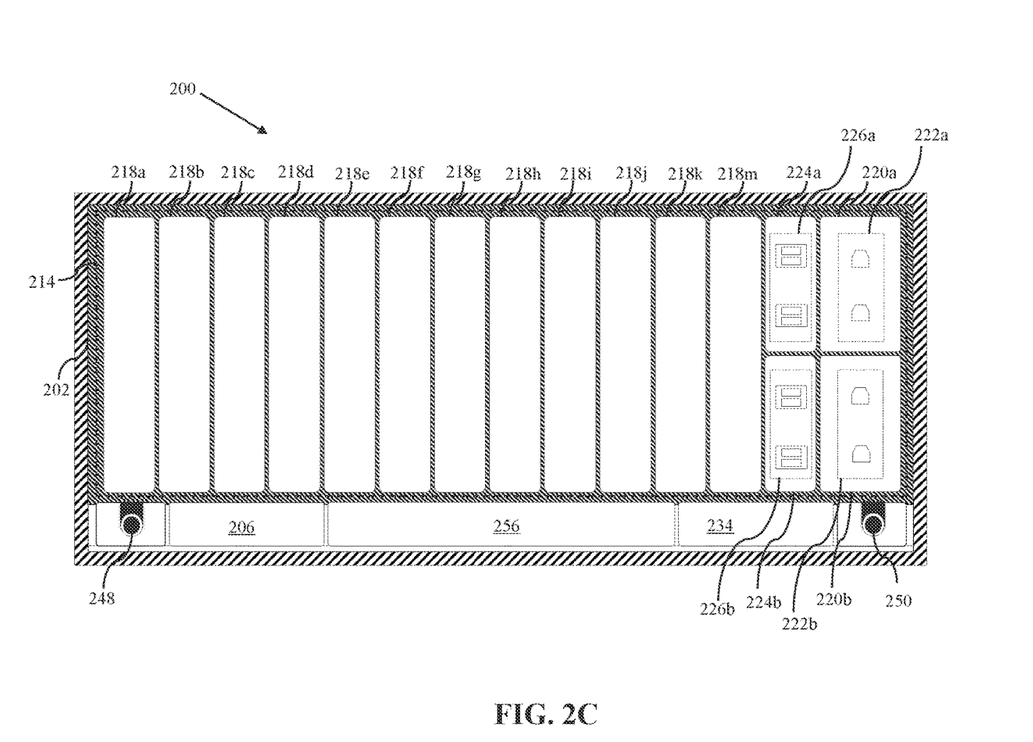
FIG. 2C illustrates a front view of the enclosure that provides the liquid film cooling to the heat generating components, in accordance with an embodiment of the present invention.
Figure 2D:
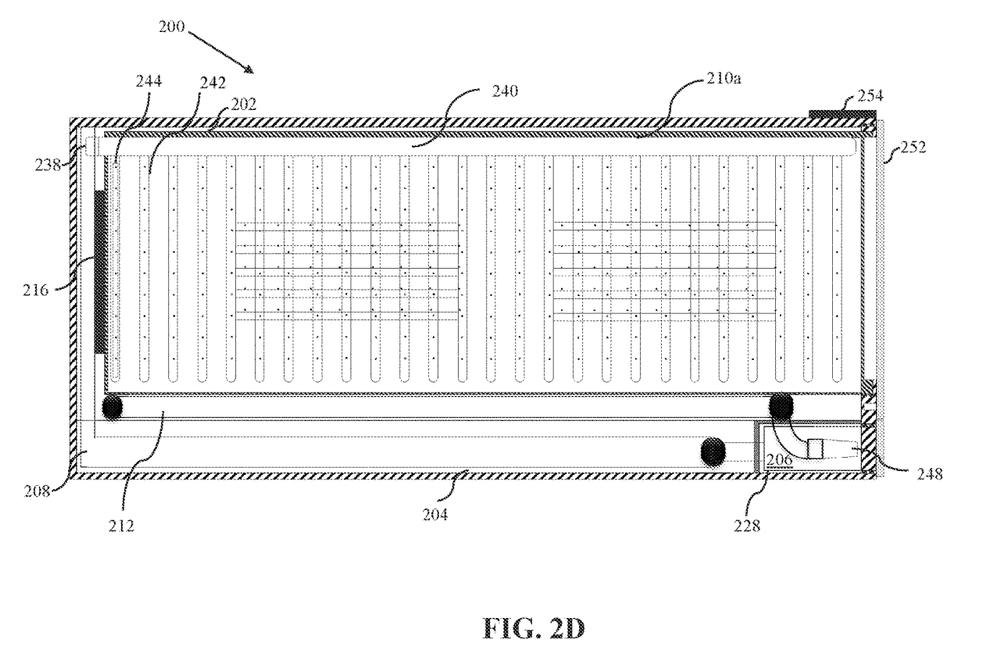
FIG. 2D illustrates a side cutaway view of the enclosure that provides the liquid film cooling to the heat generating components, in accordance with an embodiment of the present invention.

FIGS. 2A through 2D illustrate various views of an enclosure 200 that provides liquid film cooling to heat generating components. FIG. 2A illustrates a top view, FIG. 2B illustrates a top cutaway view, FIG. 2C illustrates a front view, and FIG. 2D illustrates a side cutaway view of the enclosure 200, in accordance with an embodiment of the present invention. The enclosure 200 is structurally and functionally similar to the enclosures 106a-106h of FIG. 1A. The enclosure 200 includes a chassis 202 (shown in FIGS. 2A, 2C, and 2D) and a cooling system having a sump 204 (shown in FIG. 2D), a first pump 206 (shown FIGS. 2B through 2D), a plumbing system 208 (shown in FIGS. 2B and 2D), a set of tube plates 210a-210o (shown in FIGS. 2A and 2D), and a heat exchanger 212 (shown in FIGS. 2B and 2D). Here, the cooling system is a direct spray cooling system.

The chassis 202 accommodates a hot swappable cassette system 214 (shown in FIG. 2C) and a backplane 216 (shown in FIG. 2D). The backplane 216 is mounted at a back end of the chassis 202. The hot swappable cassette system 214 holds a set of cassettes 218a-218m (shown in FIG. 2C), interfacing cables that connect the set of cassettes 218a-218m to various components embedded on a circuit board (not shown), and a set of backplane connectors (not shown) to connect the corresponding set of cassettes 218a-218m to the backplane 216. Each cassette of the set of cassettes 218a-218m holds a set of circuit boards (not shown) that houses the heat generating components. The heat generating components may include, but are not limited to, computer processors (e.g. processors for bitcoin mining), graphics processors, microprocessors, blade servers, circuit boards, memory, video cards, power devices, or the like. The present invention should not be construed to be limited to any one type of heat generating system. Each cassette of the set of cassettes 218a-218m is mounted vertically and slidably attached to the chassis 202. Each cassette of the set of cassettes 218a-218m can slide into the chassis 202 and can be easily accessed and removed from the chassis 202 for routine maintenance. The chassis 202 has a sturdy frame with a plurality of slots. Each slot of the plurality of slots corresponds to a cassette of the set of cassettes 218a-218m. Each cassette of the set of cassettes 218a-218m slides along rails within each slot. The rails assist in aligning the set of cassettes 218a-218m to the backplane 216. In an embodiment, the chassis 202 is made of at least one of carbon steel, aluminum alloys, copper, or the like. The chassis 202 has a provision of a locking mechanism to hold the set of cassettes 218a-218m in the respective slots. The locking mechanism ensures that the set of cassettes 218a-218m is held in place once they are placed in the chassis 202 and do not shift out of place. The locking mechanism includes mechanical locks, electrical switch locks, latches, or the like.

As shown in FIG. 2C, the hot swappable cassette system 214 further holds a first power supply 220a to supply power to the heat generating components. The hot swappable cassette system 214 further holds a second power supply 220b to supply power to the heat generating components when the first power supply 220a is non-operational. The use of a redundant power supply, such as, the second power supply 220b ensures that there is no absence or shortage of power to the heat generating components. At any time instance, only one of the first and second power supplies 220a and 220b is operational. The first and second power supplies 220a and 220b have first and second power connector port housings 222a and 222b, respectively, to mount external power supplies.

The hot swappable cassette system 214 further holds first and second network switches 224a and 224b to provide external network connectivity. The first and second network switches 224a and 224b connect the hot swappable cassette system 214 to a local area network or an Internet. The first and second network switches 224a and 224b have first and second network connector port housings 226a and 226b, respectively, to mount external network switches.

The backplane 216 connects various components of the chassis 202, such as the set of cassettes 218a-218m, the first and second power supplies 220a and 220b, and the first and second network switches 224a and 224b, together. The first and second power supplies 220a and 220b and the first and second network switches 224a and 224b are connected to the backplane 216 by way of the set of backplane connectors. Thus, the heat generating components located inside the set of cassettes 218a-218m receive power from the first and second power supplies 220a and 220b by way of the backplane 216. The backplane 216 also facilitates network connectivity between the set of cassettes 218a-218m and the first and second network switches 224a and 224b. The backplane 216 can be fastened to the chassis 202 by means of commonly used standoffs and fasteners (not shown). The chassis 202 further includes chassis hinge pins (not shown) to mount the chassis 202 in the enclosure 200.

As shown in FIG. 2D, bottom of the enclosure 200 is designed to form the sump 204 to accommodate the liquid that is used to absorb heat from the heat generating components. In an embodiment, the first pump 206 (shown in FIGS. 2B, 2C, and 2D) is positioned near the bottom of the enclosure 200 for drawing out the liquid from the sump 204. The enclosure 200 includes a first pump housing 228 (shown in FIG. 2D) to house the first pump 206. The first pump 206 has an inlet coupling 230a (shown in FIG. 2B) by way of which the first pump 206 is connected to the sump 204. The liquid enters the first pump 206 by way of the inlet coupling 230a. The first pump 206 further has an outlet coupling 232a (shown in FIG. 2B) by way of which the first pump 206 is connected to the plumbing system 208 for supplying the liquid drawn from the sump 204 to the heat generating components. The first pump 206 can be located inside or outside the sump 204 to draw the liquid from the sump 204. In an example, the first pump 206 is a centrifugal pump. It will apparent to a person skilled in the art that the centrifugal pump is one example of a type of pump that can be used to draw liquid and any other kind of pump that draws the liquid can also be used in the present invention.

The enclosure 200 further includes a second pump 234 (shown in FIGS. 2B and 2C) which is similar to the first pump 206 in operation. In an embodiment, the first pump 206 and the second pump 234 are located at a pre-determined distance from each other. The second pump 234 has an inlet coupling 230b (shown in FIG. 2B) by way of which the second pump 234 is connected to the sump 204. The liquid enters the second pump 234 by way of the inlet coupling 230b. The second pump 234 further has an outlet coupling 232b (shown in FIG. 2B) by way of which the second pump 234 is connected to the plumbing system 208 for supplying the liquid drawn from the sump 204 to the heat generating components. The enclosure 200 includes a second pump housing (not shown) to house the second pump 234. The second pump 234 is located inside or outside the sump 204. The second pump 234 functions as a redundant pump that is used to provide the liquid when the first pump 206 is non-operational. In one embodiment, the first and second pumps 206 and 234 can be operational simultaneously. The inlet and outlet couplings 230a and 232a of the first pump 206 facilitate the removal of the first pump 206 from the first pump housing 228. Similarly, the inlet and outlet couplings 230b and 232b of the second pump 234 facilitate the removal of the second pump 234 from the second pump housing. Hence, the first and second pumps 206 and 234 are easily removable for maintenance.

The plumbing system 208 includes a set of pipes that extend to various parts of the enclosure 200 to provide the liquid. The set of pipes are made of aluminum, copper, plastic, polymerization of vinyl chloride (PVC), or the like. The plumbing system 208 is connected to the first and second pumps 206 and 234 for receiving the liquid drawn from the sump 204. The plumbing system 208 includes a first back flow valve 236a (shown in FIG. 2B) connected between the outlet coupling 232a of the first pump 206 and the plumbing system 208, and a second back flow valve 236b (shown in FIG. 2B) connected between the outlet coupling 232b of the second pump 234 and the plumbing system 208. The first and second back flow values 236a and 236b prevent the liquid from circulating back through the first and second pumps 206 and 234, respectively, when one or both of the first and second pumps 206 and 234 are not operational. For example, when the first pump 206 is operational and the second pump 234 is not operational, the second back flow valve 236b ensures that the liquid does not circulate back to the sump 204 by way of the second pump 234. Similarly, when the second pump 234 is operational and the first pump 206 is not operational, the first back flow valve 236a ensures that the liquid does not circulate back to the sump 204 by way of the first pump 206.

The set of tube plates 210a-210o is attached to the plumbing system 208 for receiving the liquid. In an embodiment, the set of tube plates 210a-210o is made of aluminum. It will be apparent to those skilled in the art that the set of tube plates 210a-210o can be made up of any material that can circulate the liquid. The set of tube plates 210a-210o is in fluid communication with the plumbing system 208 by way of a manifold 238 (shown in FIGS. 2A and 2B). The size of the manifold 238 is adjusted to maintain even pressure and distribution of the liquid to the set of tube plates 210a-210o. In an embodiment, a set of cold plates (not shown) with holes embedded on them can be used instead on the set of tube plates 210a-210o.

The chassis 202 is designed in such a way that each tube plate of the set of tube plates 210a-210o is positioned between two cassettes of the set of cassettes 218a-218m. Moreover, the dimension of each tube plate is such that each tube can be positioned between two cassettes of the set of cassettes 218a-218m inside the chassis 202. For example, a first tube plate 210a is positioned between first and second cassettes of the set of cassettes 218a and 218b inside the chassis 202. The dimensions of the set of tube plates 210a-210o are considered while designing the chassis 202.

In FIG. 2D, the first tube plate 210a includes a spray manifold 240 (shown in FIG. 2D) and a set of spray tubes 242 (shown in FIG. 2D) that is attached to the spray manifold 240. The set of spray tubes 242 includes vertical spray tubes in fluid communication with the spray manifold 240 and horizontal spray tubes in fluid communication with the vertical spray tubes. The liquid circulates inside the set of spray tubes 242. Each spray tube of the set of spray tubes 242 has nozzles 244 (shown in FIG. 2D) embedded thereon. The size and number of the nozzles 244 may vary depending on the amount of liquid required to absorb the heat generated by the heat generating components. The heat generated by the heat generating components can be absorbed by the first tube plate 210a by radiation as the first tube plate 210a is at a lower temperature compared to the heat generating components. The heat is further transferred to the liquid circulating inside the set of spray tubes 242 of the first tube plate 210a. The set of spray tubes 242 uses a spray method to spray the liquid directly onto the heat generating components by way of the nozzles 244. The nozzles 244 are designed and positioned such that they can efficiently deliver the liquid onto entire surface of the heat generating components. The set of spray tubes 242 have nozzles 244 embedded on both sides, and hence directly spray the liquid onto the one side of the first cassette and onto the other side of the second cassette. For example, the first tube plate 210a sprays the liquid on a front side of the first cassette and on a back side of the second cassette. The spray method of delivering the liquid is explained in detailed in FIG. 2E.

For zones inside the cassette occupied by high heat generating components such as processors, the number of spray tubes 242 required is more as compared to zones occupied by low heat generating components. This increases a flow rate of the liquid, and further increases the amount of liquid sprayed onto the heat generating components. The enclosure 200 further includes bypass valves 246 (shown in FIG. 2A) for each tube plate to control the flow of liquid in the set of tube plates 210a-210o. The bypass valves 246 are connected between the manifold 238 and the corresponding tube plates 210a-210o. For example, a bypass valve 246 stops the flow of liquid in the first tube plate 210a during the removal of cassettes from the chassis 202.

The liquid forms a thin film on surfaces of the heat generating components because of its low surface tension. The liquid upon contact with the heat generating components evaporates into vapors. The set of tube plates 210a-210o further condenses the vapors into a condensed liquid when the vapors come in contact with the set of tube plates 210a-210o. The condensed vapor forms droplets that fall down into the sump 204 due to gravity. Thus, the function of each tube plate of the set of tube plates 210a-210o is two-fold. Firstly, the first tube plate 210a acts as a spray tube and sprays the liquid onto the heat generating components inside the set of cassettes 218a-218m and secondly, the first tube plate 210a assists in condensation of the vapors that are formed when the liquid comes in contact with the heat generating components.

The heat exchanger 212 is positioned above the sump 204 and below the chassis 202. The heat exchanger 212 extends throughout area of the chassis 202. The function of the heat exchanger 212 is to condense the vapors back into the condensed liquid. Thus, in the enclosure 200, the first tube plate 210a and the heat exchanger 212 provide the condensation of vapors into the condensed liquid. In an example, the first tube plate 210a is a plate condenser and the heat exchanger 212 is a finned condenser. The heat exchanger 212 is a condenser coil that includes tubes circulating water at ambient temperature. When the vapors come in contact with the heat exchanger 212, the heat from the vapors is transferred to the water circulating inside the heat exchanger 212. The heated water is transferred to an external centralized heat exchanger cooling system (not shown) located outside the enclosure 200 where it is cooled by way of fans, ambient temperature of air, coolers, and the like, and the cooled water is circulated back into the heat exchanger 212.

The external centralized heat exchanger cooling system includes circulation manifold pipes (not shown) that carry cooled water between the external centralized heat exchanger cooling system and the racks, such as the rack 100. Each rack, such as the rack 100, has the circulation manifold pipes running down the corners and are connected to each enclosure, such as the enclosures 106a-106h, by way of quick release valves such as water inlet and outlet couplings 248 and 250 (shown in FIGS. 2B and 2C). The cooled water from the external centralized heat exchanger cooling system enters the heat exchanger 212 by way of the water inlet coupling 248 and the heated water is transferred to the external centralized heat exchanger cooling system by way of the water outlet coupling 250. Thus, the heat from the heat generating components is removed.

The enclosure 200 may further include a vapor recovery system (not shown) for ensuring efficient condensation at various temperatures and pressures. For example, when the vapor pressure inside the chassis 202 exceeds a first predetermined threshold value, the vapor recovery system accelerates the movement of the vapors towards the heat exchanger 212, thereby assisting the condensation of the vapors. The vapor recovery system may accelerate the movement of the vapors towards the heat exchanger 212 by creating a suction between the chassis 202 and the heat exchanger 212. This prevents the buildup of the vapor pressure inside the chassis 202.

The enclosure 200 further includes filters (not shown) to clean the liquid and desiccators (not shown) to remove or de-water the liquid to prevent clogging and fouling. The filters and desiccators are strategically placed inside the enclosure 200. In an embodiment, the filters and desiccators are connected between the outlet coupling 232a of the first pump 206 and the first back flow valve 236a. Further, the filters and desiccators are connected between the outlet coupling 232b of the second pump 234 and the second back flow valve 236b. In another embodiment, the filters and desiccators are connected between the plumbing system 208 and the manifold 238.

The enclosure 200 further includes a front access panel 252 (shown in FIG. 2D) that is located at a front end of the enclosure 200. The enclosure 200 is hermetically sealed to prevent the vapors of the liquid from escaping the enclosure 200. The front access panel 252 allows for easy removal of the set of cassettes 218a-218m from the chassis 202 during routine maintenance. The front access panel 252 further allows addition and removal of various other components of the enclosure 200 such as the first and second power supplies 220a and 220b.

The enclosure 200 further includes a cartridge 254 (shown in FIG. 2D) located at a top-front end of the enclosure 200. The cartridge 254 purges non-vapor gases outside the enclosure 200 and prevents the vapors from venting outside the enclosure 200. The material of a filter media present inside the cartridge 254 prevents the vapors from venting outside the enclosure 200. The cartridge 254 allows expansion and contraction of air from within the enclosure 200 to outside the enclosure 200, and vice versa. Preventing the vapors from venting outside the enclosure 200 while allowing the expansion and contraction of air prevents loss of vapors, and thus reduces replacement costs. The absence of the cartridge 254 would result in gases, including both the vapors and air, being trapped inside the enclosure 200. This would require the enclosure 200 to be a pressurized containment, thereby making it a costly affair. To allow the expansion and contraction of the vapors without needing additional or unnecessary pressure control mechanism, there is a need to vent the gases, except the vapors, outside the enclosure 200. The cartridge 254 is thus essentially a filter which allows passage of air both ways and ensures unnecessary gases are vented outside the enclosure 200 while blocking the passage of the vapors outside the enclosure 200.

The enclosure 200 further includes a management control system 256 (shown in FIGS. 2B and 2C) that monitors and manages the enclosure 200 and its components. The management control system 256 includes sensors (not shown) that are used to monitor various parameters associated with the enclosure 200. The data from the sensors is utilized for detecting a malfunction or a condition within the enclosure 200, and for communicating the detected malfunction or condition to an operator device (not shown) or an operator. The sensors include, but are not limited to, temperature sensors, flow sensors, level sensors, pump sensors, humidity sensors, fouling sensors, voltage sensors, accelerometers, door sensors, backplane sensors, pressure sensors, and humidity and vapor saturation sensors.

The temperature sensors are strategically placed inside the enclosure 200 to measure temperatures of the liquid, the vapors, the chassis 202, the heat exchanger 212, the ambient water, the heat generating components, and the first and second power supplies 220a and 220b. The flow sensors measure a volume of water entering the heat exchanger 212 and the external centralized heat exchanger cooling system. The flow sensors can further be used to measure a volume of the liquid inside the set of spray tubes 242. The level sensors measure a volume of liquid inside the sump 204. The pump sensors measure efficiency of the first and second pumps 206 and 234. The humidity sensors measure an amount of moisture present in the chassis 202. The fouling sensors determine contaminants in the filters. The voltage sensor measures power parameters in the first and second power supplies 220a and 220b. The accelerometers detect impact to the enclosure 200 and the chassis 202, measure vibrations, and detect leveling of the chassis 202. The door sensor detects if the front access panel 252 is open. The backplane sensors determine a presence of a cassette in the chassis 202 and power consumed by the cassette. The pressure sensors determine pressure inside the chassis 202. The humidity and vapor saturation sensors measure the amount of vapor present in the chassis 202.

The number of sensors depends on a level of precision desired in controlling and monitoring the enclosure 200. The sensors can be located on the components as well as within the components, such as within the sump 204, to monitor conditions and provide the data to the management control system 256. The data obtained from the sensors allow the enclosure 200 to improve its performance, efficiency, accuracy and stability. Increasing the number of sensors allow the operation of the cooling system employed in the enclosure 200 to be controlled within a tighter operating range, which can improve performance, efficiency, accuracy and stability. Decreasing the number of sensors can reduce cost and complexity of the cooling system.

The management control system 256 further includes processing circuitry (not shown) that receives the data from the sensors. Each sensor can be electrically connected or wirelessly connected to the processing circuitry. Upon detection or indication of a malfunction within the enclosure 200, the processing circuitry can be configured to notify the operator. The processing circuitry can be configured to send alarms and alerts by way of Short Message Service (SMS), Electronic mail (E-mail), Simple Network Management Protocol (SNMP), and audible buzzer alarms to the operator to alert the operator of the malfunction or the condition. The alarms or alerts include specific details associated with the malfunction, including information recorded from the sensors connected to the processing circuitry. The alarms or alerts also include a part number associated with the component that has likely failed in order to permit the operator to immediately determine if the part exists in local inventory. If the part does not exist, the operator can order a replacement part from a vendor as soon as possible. The alarms or alerts, and any data relating to the malfunction, can be stored in a computer readable medium (e.g. memory) and/or transmitted to a system manufacturer for quality control, warranty, and/or recall purposes.

The processing circuitry include one or more microcontrollers, microprocessors, digital signal processors (DSPs), field programmable gate arrays (FPGAs), programmable logic devices (PLDs), application specific integrated circuits (ASICs), or the like. In some cases, the functions of the processing circuitry may also be performed by discrete digital components and/or discrete analog components. It is understood by a person skilled in the art that processing circuitry and/or the sensors may include various other electrical components, including integrated circuits (ICs) and/or discrete components.

The sensors may communicate with the processing circuitry through wireless communication. Wireless communication may take place using one or more wireless communication protocols such as Bluetooth, Bluetooth Low Energy, ZigBee, and/or Wi-Fi. Alternatively, wireless communication may be implemented using known methods of optical or infrared communication.

The use of sensors enables the operator to monitor cooling needs for each chassis 202 and hence aids in providing dynamic cooling at chassis level. Thus, the operator can initiate and tune the cooling system, and then leave it up to the management control system 256 to dynamically manage the cooling process. In an example, data obtained from the level sensor is used by the management control system 256 to determine when the volume of liquid inside the sump 204 has reached below a second predetermined threshold value and send an alert to the operator indicating a replenishment requirement of the liquid in the sump 204. In another example, data obtained from the level sensor is used to determine when the efficiency of the first pump 206 reaches below a third predetermined threshold value. The management control system 256 deactivates the first pump 206 and activates the second pump 234. Further, with the use of the sensors, it is possible to determine an amount of energy used by an enclosure for the cooling process. This data can be used by the management control system 256 to determine variable cooling costs for different enclosures based on corresponding energy usage. Thus, a third enclosure utilizing a large amount of energy to remove a large amount of heat that it generates will have a higher cooling cost than a fourth enclosure utilizing a comparatively less amount of energy.

The management control system 256 further includes a Liquid Crystal Display (LCD) to display system parameters, messages, and operating status. The management control system 256 further includes communication ports to control the racks (such as rack 100) in the data center and the external heat exchangers such as the external centralized heat exchanger cooling system.

In operation, the first pump 206 draws the liquid from the sump 204 and supplies the liquid to the plumbing system 208. The plumbing system 208 is connected to the manifold which supplies the liquid to the set of tube plates 210a-210o. Because of placement of the set of tube plates 210a-210o in the chassis 202, the set of tube plates 210a-210o absorb heat generated by the heat generating components by way of radiation. This is because the set of tube plates 210a-210o are at a lower temperature than the heat generating components. The set of tube plates 210a-210o transfer the absorbed heat to the liquid circulating inside the set of tube plates 210a-210o.

The set of tube plates 210a-210o spray the liquid onto the set of cassettes 218a-218m. The nozzles 244 are embedded on the spray tubes 242 such that a first set of nozzles 244 spray the liquid on a front side of the first cassette and a second set of nozzles 244 spray the liquid on a back side of the second cassette. The liquid forms a thin film on the surfaces of the heat generating components because of its low surface tension. The low surface tension of the liquid also ensures that the thin film coats an entire surface of the cassette. The liquid that is not used is collected in the sump 204. The thin film of liquid absorbs heat from the heat generating components and is evaporated into vapors thereby removing heat from the heat generating components.

The vapors formed are present in the chassis 202 and move towards the set of tube plates 210a-210o placed in front of the set of cassettes 218a-218m. When the vapors come in contact with the set of tube plates 210a-210o which is at lower temperature than the vapors, the vapors condense on the surface of the set of tube plates 210a-210o. The set of tube plates 210a-210o is at the lower temperature as the liquid circulates inside the set of tube plates 210a-210o and the temperature of the liquid obtained from the sump 204 is maintained at a much lower temperature than the heat generating components. The condensed vapors on the surface of the set of tube plates 210a-210o form droplets which fall back into the sump 204 as the condensed liquid.

Similarly, the vapors inside the chassis 202, which are denser in weight than dry air, move towards the heat exchanger 212 located at the bottom of the chassis 202. The heat exchanger 212 is maintained at a lower temperature than the vapors by ambient temperature water circulating inside the heat exchanger 212. Thus, when the vapors come in contact with the heat exchanger 212, the heat exchanger 212 absorbs heat from the vapors and the vapors condense on the surface of the heat exchanger 212 and then fall back into the sump 204 as the condensed liquid. The absorbed heat is transferred to the ambient temperature water and hence the temperature of the water increases. The heated water is carried by a water network to the external centralized heat exchanger system placed outside the enclosure 200. The external centralized heat exchanger system uses fans, coolers, and ambient temperature air to cool the heated water by expelling the heat from the heated water to the atmosphere. The cooled water is circulated back into the heat exchanger 212.

The circulation of the liquid inside the set of tube plates 210a-210o and the circulation of the ambient temperature water inside the heat exchanger 212 have their separate closed loop systems, and hence the liquid and the ambient temperature water does not mix. The unused liquid and the condensed liquid collected at the sump 204 are then reused for circulation.

Figure 2E:
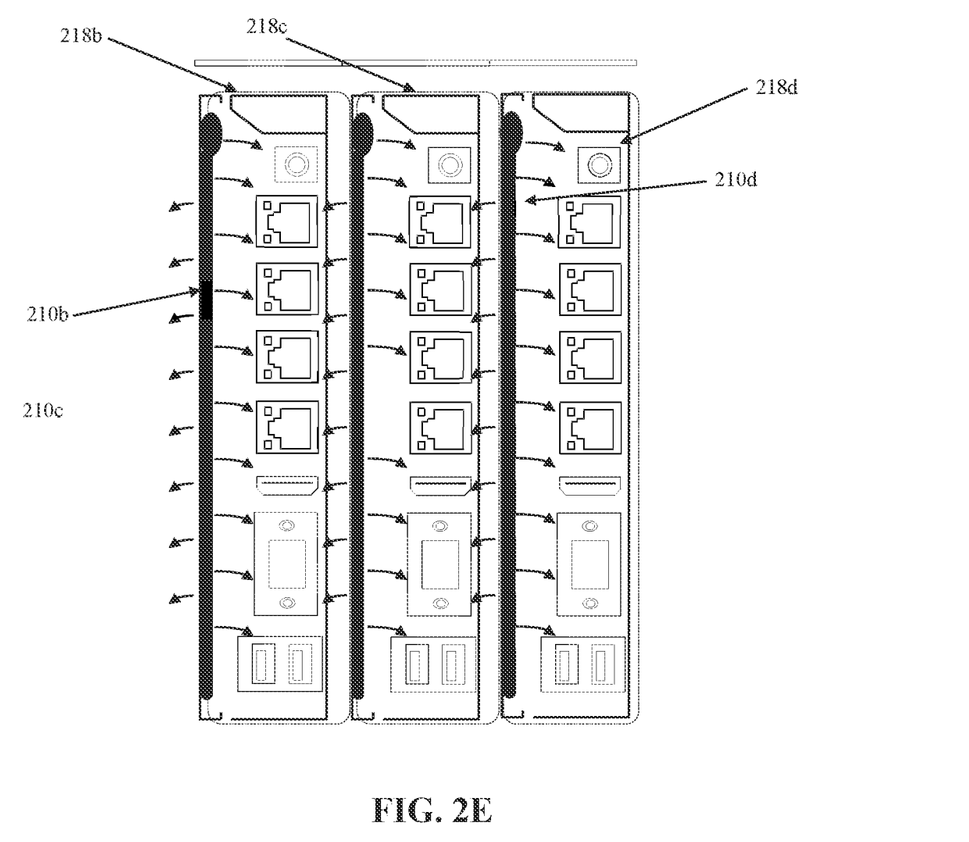
FIG. 2E illustrates a spray method of delivering a liquid onto heat generating components in the enclosure, in accordance with an embodiment of the present invention.

Referring now to FIG. 2E that illustrates the spray method of delivering the liquid onto the heat generating components, in accordance with an embodiment of the present invention. A second tube plate 210b is positioned between a third cassette (not shown) and a fourth cassette 218b. A third tube plate 210c is positioned between the fourth cassette 218b and a fifth cassette 218c. A fourth tube plate 210d is positioned between the fifth cassette 218c and a sixth cassette 218d. The set of spray tubes (not shown) are embedded on the fourth tube plate 210d such that the fourth tube plate 210d sprays the liquid on a front side of the sixth cassette 218d and a back side of the fifth cassette 218c. It will be apparent to a person skilled in the art that each tube plate of the set of tube plates 210a-210o, including the second and third tube plates 210b and 210c, perform similar functions as the fourth tube plate 210d. The two-directional spraying of the liquid by the set of tube plates 210a-210o leads to efficient removal of heat from the heat generating components.

It will be apparent to a person skilled in the art that even though the present invention talks about a use of a spray method to deliver the liquid onto the heat generating components, other methods can also be used as a delivery method in the enclosure 200. In another embodiment, a waterfall method can be used to deliver the liquid. In the waterfall method, the set of tube plates 210a-210o have holes at a top end to deliver the liquid at a top end of the set of cassettes 218a-218m and allowing the gravity to pull the liquid down the surfaces of the set of cassettes 218a-218m, thereby forming the thin film. The unused liquid is collected back in the sump 204.

Specific advantages of the present invention include the use of the enclosure 200 to provide the liquid film cooling to the heat generating components. The enclosure 200 being hermetically sealed ensures that the vapors do not escape into the atmosphere and thus avoid loss of the vapors. Further, each enclosure mounted on the rack 100, has its own heat exchanger such as the heat exchanger 212. The presence of the heat exchanger 212 inside the enclosure 200 ensures that the vapors formed due to evaporation of the liquid are quickly condensed back into the condensed liquid. Thus, the vapors do not have to be transferred to a heat exchanger that is placed outside the enclosure as is in case of conventional enclosures. Hence, the loss of vapors during the transfer is minimized.

In conventional enclosures, spray tubes do not perform the two-fold function that is performed by the set of tube plates 210a-210o. Hence, the additional condensation surfaces are provided by the set of tube plates 210a-210o. The design of chassis 202 allows the set of tube plates 210a-210o to be positioned between the set of cassettes 218a-218m. Thus, the design of the chassis 202 and the positions of the nozzles 244 on the set of spray tubes 242 ensure that an entire surface of the heat generating components is coated with the liquid and heat is uniformly removed from the heat generating components. This avoids creation of hot spots. The presence of components such as the sump 204, the first and second pumps 206 and 234, and the plumbing system 208 inside the enclosure 200 further improves the efficiency, stability, and performance of the enclosure 200.

The liquid film cooling method has advantages over conventional cooling methods such as forced air cooling and liquid immersion cooling. The liquid film cooling method uses a considerably small amount of power for its operation than the forced air cooling. This is because the liquid film cooling method eliminates the need for fans, air management measure, and chiller infrastructure used in the forced air cooling method and uses the heat exchanger 212 and the set of tube plates 210a-210o to remove heat from the heat generating components. This further makes the liquid film cooling method inexpensive as compared to the forced air cooling. The liquid film cooling method is considerably inexpensive and lighter in weight than the liquid immersion cooling method as it uses a small amount of the liquid. Further, the absence of immersion baths, used in the immersion cooling method, reduces the floor space required and eliminates the use of load spreaders.

The design of the chassis 202 and the liquid film cooling method optimizes a space available on the rack 100 and allows for mounting more than one enclosure on a shelf 104a of the rack 100. Hence, the number of servers or other heat generating components mounted on the rack 100 increases as compared to racks that mount conventional enclosures using cooling methods other than the liquid film cooling method. For example, if the number of servers mounted on racks that mount conventional enclosures is 192 servers, then the number of servers mounted on the rack 100 is in the range of 400 to 500 servers. Further, the enclosure 200 can be easily deployed on standard data center racks such as the rack 100 with few modifications to the racks. Dynamic cooling can be implemented in the enclosure 200 because of the use of the management control system 256. The design of chassis 202 allows effective cooling of the heat generating components in the enclosure. Moreover, the design of the chassis 202 allows easy deployment of the cooling system in the enclosure 200. The enclosure 200 prevents the leakage of vapors of the liquid, thereby avoiding the loss of the liquid.

Although the present invention describes use of direct spray cooling method and its various advantages, the scope of the present invention is not limited to it. In an embodiment of the present invention, various other forms of liquid film cooling methods such as misting and fogging cooling methods may be used as alternate techniques for the direct spray cooling method. A primary difference between the direct spray cooling method and the misting and fogging cooling methods is the size of liquid droplets. In the misting and fogging cooling methods, the liquid to be delivered is converted into mists and fog, respectively. In an embodiment, ultrasonic devices (not shown) can be used to convert the liquid to be delivered into the mists and the fog. The misting and fogging cooling methods can be implemented in the enclosure 200 for cooling the heat generating components. The smaller droplet size in the misting and fogging cooling methods increases surface area coverage of the heat generating components that may be coated with the mists and the fog, thereby providing an efficient method of thoroughly coating surfaces of the heat generating components.

This further enhances the conversion (i.e., evaporation) of the mists and the fog into vapors, thereby providing efficient and effective cooling.

Techniques consistent with the present invention provide, among other features, enclosure for providing liquid film cooling. While various exemplary embodiments of the disclosed system and method have been described above it should be understood that they have been presented for purposes of example only, not limitations. It is not exhaustive and does not limit the invention to the precise form disclosed. Modifications and variations are possible in light of the above teachings or may be acquired from practicing of the invention, without departing from the breadth or scope.

In the claims, the words 'comprising', 'including' and 'having' do not exclude the presence of other elements or steps then those listed in a claim. The terms "a" or "an," as used herein, are defined as one or more than one. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. An enclosure for providing liquid film cooling to a plurality of heat generating components, the enclosure comprising:
    a chassis comprising a plurality of cassettes, wherein each cassette of the plurality of cassettes includes one or more heat generating components of the plurality of heat generating components, wherein the plurality of cassettes is slidably attached to the chassis;
    a sump for storing a liquid to be supplied to the plurality of heat generating components;
    a first pump for drawing the liquid from the sump;
    a plumbing system to receive the liquid from the sump by way of the first pump;
    a plurality of tube plates connected to the plumbing system to receive the liquid, wherein a tube plate of the plurality of tube plates is placed between a first cassette and a second cassette of the plurality of cassettes, and wherein the plurality of tube plates directly spray the liquid onto the plurality of heat generating components by way of nozzles embedded on the plurality of tube plates, whereby the liquid is evaporated into vapors upon contact with the plurality of heat generating components; and
    a heat exchanger, placed below the chassis, to condense the vapors into condensed liquid upon contact with the heat exchanger, whereby the condensed liquid is collected in the sump.

2. The enclosure of claim 1, wherein the chassis further comprises at least one power supply unit to supply power to the one or more heat generating components and at least one network switch to provide network connectivity externally to at least a local area network or an Internet.

3. The enclosure of claim 2, wherein the chassis further comprises a backplane housed at a back end of the chassis to allow the plurality of cassettes to share a common power and data bus with the at least one power supply and the at least one network switch.

4. The enclosure of claim 1, further comprising a second pump for drawing the liquid from the sump, wherein at least one of the first and second pumps is operational at a time instant.

5. The enclosure of claim 4, wherein the plumbing system is equipped with back flow check valves to prevent the liquid from circulating back through the first and second pumps when at least one of the first and second pumps is non-operational.

6. The enclosure of claim 1, further comprising bypass valves connected between the plumbing system and the plurality of tube plates to control a flow of liquid in the plurality of tube plates.

7. The enclosure of claim 1, wherein the plurality of tube plates further provides condensation of the vapors into the condensed liquid when the vapors come in contact with the plurality of tube plates.

8. The enclosure of claim 1, wherein the plurality of tube plates further absorb heat from the plurality of heat generating components by way of radiation and transfer the heat to the liquid circulating inside the plurality of tube plates.

9. The enclosure of claim 1, further comprising a plurality of sensors to monitor health and operating parameters of the enclosure, wherein the plurality of sensors includes at least one of a temperature sensor, a flow sensor, a pump sensor, a humidity sensor, a fouling sensor, a voltage sensor, an accelerometer, a door sensor, a backplane sensor, a pressure sensor, or humidity and vapor saturation sensors.

10. The enclosure of claim 9, further comprising a management control system to monitor and manage the enclosure based on outputs received from the plurality of sensors.

11. The enclosure of claim 1, further comprising a cartridge to purge non-vapor gases outside the enclosure and prevent the vapors from venting outside the enclosure.

12. A rack having a plurality of shelves, the rack comprising:
    a plurality of enclosures positioned on a shelf of the plurality of shelves, wherein a first enclosure of the plurality of enclosures is accessible from a front end of the rack and a second enclosure of the plurality of enclosures is accessible from a back end of the rack, and wherein each of the first and second enclosures of the plurality of enclosures comprises:
        a chassis comprising a plurality of cassettes, wherein each cassette of the plurality of cassettes includes one or more heat generating components, wherein the plurality of cassettes is slidably removable from the chassis;
        a sump for storing liquid to be supplied to the one or more heat generating components;
        a first pump for drawing the liquid from the sump;
        a plumbing system to receive the liquid from the sump by way of the first pump; and
        a plurality of tube plates connected to the plumbing system to receive the liquid, wherein a tube plate of the plurality of tube plates is placed between first and second cassettes of the plurality of cassettes, and wherein the plurality of tube plates directly spray the liquid onto the one or more heat generating components by way of nozzles embedded on the plurality of tube plates, whereby the liquid is evaporated into vapors upon contact with the one or more heat generating components.

13. The rack of claim 12, further comprising a heat exchanger, placed below the chassis, to condense the vapors into condensed liquid upon contact with the heat exchanger, whereby the condensed liquid is collected in the sump.

14. The rack of claim 12, wherein the chassis further comprises at least one power supply unit to supply power to the one or more heat generating components and at least one network switch to provide network connectivity externally to at least a local area network or an Internet.

15. The rack of claim 14, wherein the chassis further comprises a backplane housed at a back end of the chassis to allow the plurality of cassettes to share a common power and data bus with the at least one power supply and the at least one network switch.

16. The rack of claim 12, further comprising a second pump for drawing the liquid from the sump, wherein at least one of the first and second pumps is operational at a time instant.

17. The rack of claim 12, wherein the plurality of tube plates further provides condensation of the vapors into condensed liquid when the vapors come in contact with the plurality of tube plates.

18. The rack of claim 12, wherein the plurality of tube plates further absorb heat from the one or more heat generating components by way of radiation and transfer the heat to the liquid circulating inside the plurality of tube plates.

19. The rack of claim 12, further comprising a plurality of sensors to monitor health and operating parameters of the enclosure, wherein the plurality of sensors includes at least one of a temperature sensor, a flow sensor, a pump sensor, a humidity sensor, a fouling sensor, a voltage sensor, an accelerometer, a door sensor, a backplane sensor, a pressure sensor, or humidity and vapor saturation sensors.

20. The rack of claim 19, further comprising a management control system to monitor and manage the enclosure based on outputs received from the plurality of sensors.

* * * * *